United States Patent [19]

Miyamoto

[11] 4,388,496
[45] Jun. 14, 1983

[54] FM/AM STEREO RECEIVER

[75] Inventor: Yukihiko Miyamoto, Tokyo, Japan

[73] Assignee: Trio Kabushiki Kaisha, Tokyo, Japan

[21] Appl. No.: 291,968

[22] Filed: Aug. 11, 1981

[30] Foreign Application Priority Data

Aug. 11, 1982 [JP] Japan .................. 55-113543[U]
Aug. 11, 1982 [JP] Japan .................. 55-113544[U]

[51] Int. Cl.³ .................. H03D 3/22; H04H 5/00
[52] U.S. Cl. .................. 179/1 GS; 455/144
[58] Field of Search .......... 179/1 GB, 1 GC, 1 GD,
179/1 GS; 455/143, 144

[56] References Cited
U.S. PATENT DOCUMENTS 3,665,507  5/1972  Peil .................. 455/144 X
3,800,226  3/1974  Close .................. 455/144 X
3,999,138  12/1976  Peil et al. .................. 455/144 X

FOREIGN PATENT DOCUMENTS 55-26749  2/1980  Japan .................. 455/144

Primary Examiner—R. J. Hickey
Attorney, Agent, or Firm—Gerald J. Ferguson, Jr.; Joseph J. Baker; C. Lamont Whitham

[57] ABSTRACT

An FM/AM stereo receiver for receiving an RF FM stereo signal by FM stereo broadcasting and an RF AM stereo signal of AM-PM or AM-FM system by AM stereo broadcasting. One limiter is used both as a limiter for limiting an IF FM stereo signal in an FM stereo receiving system and as a limiter for obtaining an IF PM or FM difference signal in an AM stereo receiving system. One FM demodulator is employed both as an FM demodulator for obtaining a composite signal in the FM stereo receiving system and as an IF demodulator for obtaining an IF PM difference signal or a difference signal in the AM stereo receiving system.

8 Claims, 7 Drawing Figures

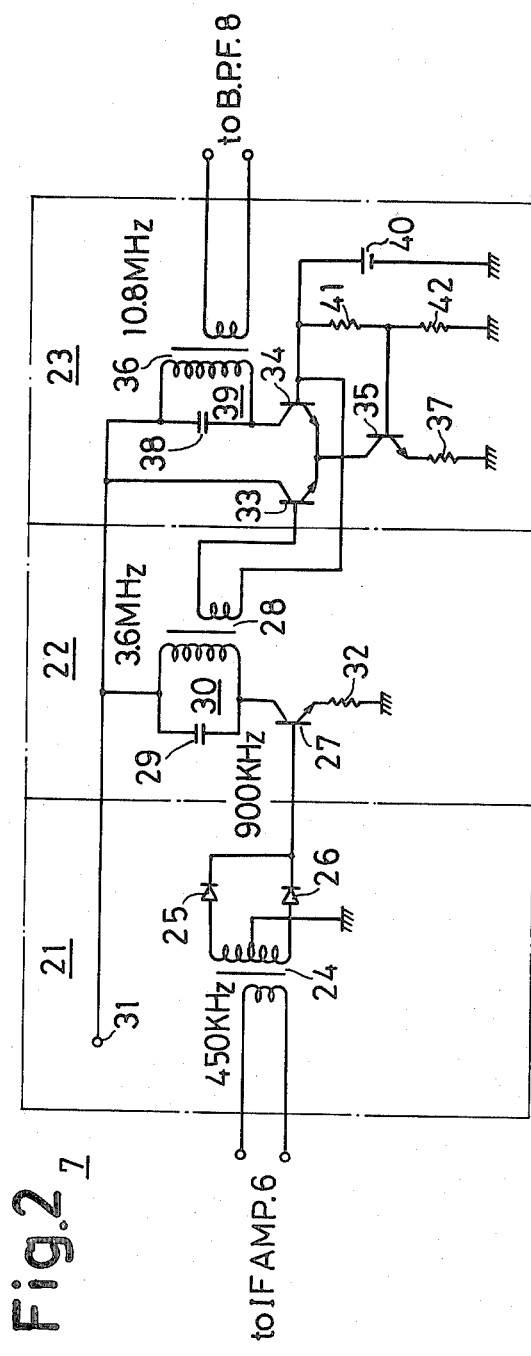
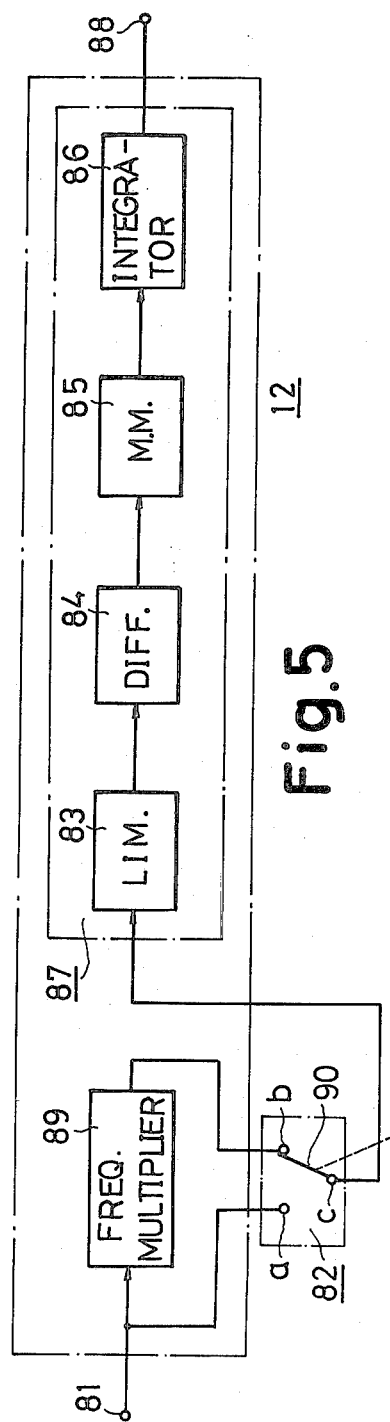
Fig.2
Fig.5

FM/AM STEREO RECEIVER

BACKGROUND OF THE INVENTION

1. Field of the Invention

The present invention relates to an FM/AM stereo receiver which is capable of receiving both FM and AM stereo broadcasting signals.

2. Description of the Prior Art

An FM/AM stereo receiver has an FM stereo receiving system for receiving an FM stereo broadcasting signal and an AM stereo receiving system for receiving an AM stereo broadcasting signal.

The FM stereo receiving system receives an RF FM stereo signal of the standard FM stereo broadcasting system now in use. In the RF FM stereo signal, a main carrier of a radio frequency (a frequency in an FM broadcasting frequency band ranging from 88.0 to 108.0 MHz in U.S.A. and 76.0 to 90.0 MHz in Japan) is frequency modulated by a composite stereo signal. The composite signal includes a main channel signal, a subchannel signal lying in a frequency band (the band width of which is 15 KHz) higher than that of the main channel signal and a pilot tone lying between the frequency band of the main channel signal and the frequency band (the band width of which is 30 KHz) of the subchannel signal. The main channel signal is composed of a sum signal (L+R) of a left signal (L) having an audio frequency and a right signal (R). In the subchannel signal, a subcarrier of a frequency (38 KHz) sufficiently lower than that of the main carrier is amplitude modulated by a difference signal (L−R) of the left signal (L) and the right signal (R) in an AM suppressed carrier system. The pilot tone has a frequency (19 KHz) which is one-half of the frequency of the subcarrier.

The AM stereo receiving system receives an RF AM stereo signal. The AM stereo broadcasting is now under study for operation. One of RF AF stereo signals of promising AM stereo broadcasting systems is an RF AM stereo signal of an AM-PM system (such as Magnavox system) and another one is an RF AM stereo signal of an AM-FM system (such as Belar system).

In the RF AM stereo signal of the AM-PM system, a phase-modulated signal, obtained by phase modulating a carrier of the radio frequency (a frequency in an AM broadcasting frequency band, that is, in the range of 535 to 1605 KHz in U.S.A. and Japan) by the difference signal (L−R), is amplitude modulated by the sum signal (L+R). In the RF AM stereo signal of the AM-FM system, a frequency-modulated carrier, obtained by frequency modulating the carrier of the radio frequency by the difference signal (L−R), is amplitude modulated by the sum signal (L+R).

In an FM/AM stereo receiver that has heretofore been proposed for receiving the RF FM stereo signal and the RF AM stereo signal based on the AM-PM (or AM-FM) system, an FM stereo receiving system comprises an RF FM stereo tuner for selecting one of RF FM stereo signals and converting the selected RF FM stereo signal into an IF FM stereo signal the non-frequency-modulated main carrier of which has an intermediate frequency (such as 10.8 MHz) lower than the radio frequency of the non-frequency-modulated main carrier of the RF FM stereo signal, an IF FM stereo signal amplifier for amplifying the IF FM stereo signal from the tuner, a limiter for amplitude limiting the IF FM stereo signal from the amplifier, an FM demodulator for frequency demodulating the IF FM stereo signal from the limiter into a composite signal, and a stereo signal demodulator for deriving a right signal (R) and a left signal (L) from the composite signal.

An AM stereo receiving system of the prior art FM/AM stereo receiver comprises an RF AM stereo tuner for selecting one of RF AM stereo signals and converting the selected RF AM stereo signal into an IF AM stereo signal the non-phase- (or frequency-) modulated carrier of which has an intermediate frequency (such as 450 KHz) lower than the radio frequency of the non-phase- (or frequency-) modulated carrier of the RF AM stereo signal, an IF AM stereo signal amplifier for amplifying the IF AM stereo signal from the tuner, an AM demodulator for amplitude demodulating the IF AM stereo signal from the amplifier into a sum signal (R+L), a limiter for amplitude limiting the IF AM stereo signal to obtain such an IF AM (or FM) difference signal that its carrier of a frequency equal to that of the non-phase- (or frequency-) modulated carrier has been phase (or frequency) modulated by a difference signal (L−R), a PM (or FM) demodulator for phase (or frequency) demodulating the IF PM (or FM) difference signal from the limiter into the difference signal (L−R), and a matrix circuit for producing a right signal (R) and a left signal (L) by the sum signal (L+R) from the AM demodulator and the difference signal (L−R) from the PM (or FM) demodulator.

Accordingly, the conventional FM/AM stereo receiver for receiving the RF FM stereo signal and the RF AM stereo signal based on the AM-PM (or AM-FM) system includes two limiters, one for limiting the IF FM stereo signal in the FM stereo receiving system and the other for obtaining the IF PM (or FM) difference signal in the AM stereo receiving system. This is an obstacle to the manufacture of a simple, small and inexpensive FM/AM stereo receiver. Furthermore, the prior art FM/AM stereo receiver necessitates two demodulators, i.e. the FM demodulator for obtaining the composite signal in the FM stereo receiving system and the PM (or FM) demodulator for obtaining the difference signal in the AM stereo receiving system. This is another obstacle to the fabrication of the simple, small and inexpensive FM/AM stereo receiver.

SUMMARY OF THE INVENTION

Accordingly, it is an object of the present invention to provide an FM/AM stereo receiver which is free from the abovesaid defects of the prior art and is capable of receiving the RF FM stereo signal of FM stereo broadcasting and the RF AM stereo signal of the AM-PM (or AM-FM) system of AM stereo broadcasting.

In accordance with an aspect of the present invention, one limiter is employed both for limiting the IF FM stereo signal in the FM stereo receiving system and for obtaining the IF PM (or FM) difference signal in the AM stereo receiving system.

In accordance with another aspect of the present invention, when receiving an RF AM stereo signal as an RF AM stereo signal of the AM-PM system, one FM demodulator frequency demodulates an IF FM stereo signal in the FM stereo receiving system to obtain a composite signal and frequency demodulates an IF PM difference signal in the AM stereo receiving system to obtain an IF demodulated PM difference signal. The IF demodulated PM difference signal is integrated by an integrator. A cascade connection of the FM demodulator and the integrator constitutes a PM demodulator, so that the difference signal (L−R) is available from the integrator. Accordingly, the abovesaid FM demodulator is employed both for obtaining the composite signal in the FM stereo receiving system and for obtaining the IF demodulated PM difference signal in the AM stereo receiving system. In the case where the FM/AM stereo receiver receives the RF AM stereo signal as the RF AM stereo signal of the AM-FM system, one FM demodulator frequency demodulates an IF FM stereo signal in the FM stereo receiving system into a composite signal and frequency demodulates an IF FM difference signal in the AM stereo receiving system into a difference signal. Accordingly, one FM demodulator is used both for obtaining the composite signal in the FM stereo receiving system and for obtaining the difference signal (L−R) in the AM stereo receiving system. Therefore, the FM/AM stereo receiver of the present invention can be made simple, small and inexpensive as compared with the FM/AM stereo receivers heretofore proposed.

Other objects, features and advantages of the present invention will become more apparent from the following description taken in conjunction with the accompanying drawings.

BRIEF DESCRIPTION OF THE DRAWINGS

FIG. 2 is a connection diagram showing an example of a frequency multiplier used in the embodiment of FIG. 1;

FIG. 5 is a connection diagram showing another example of the FM demodulator in FIG. 3;

DESCRIPTION OF THE PREFERRED EMBODIMENTS

Figure 1:
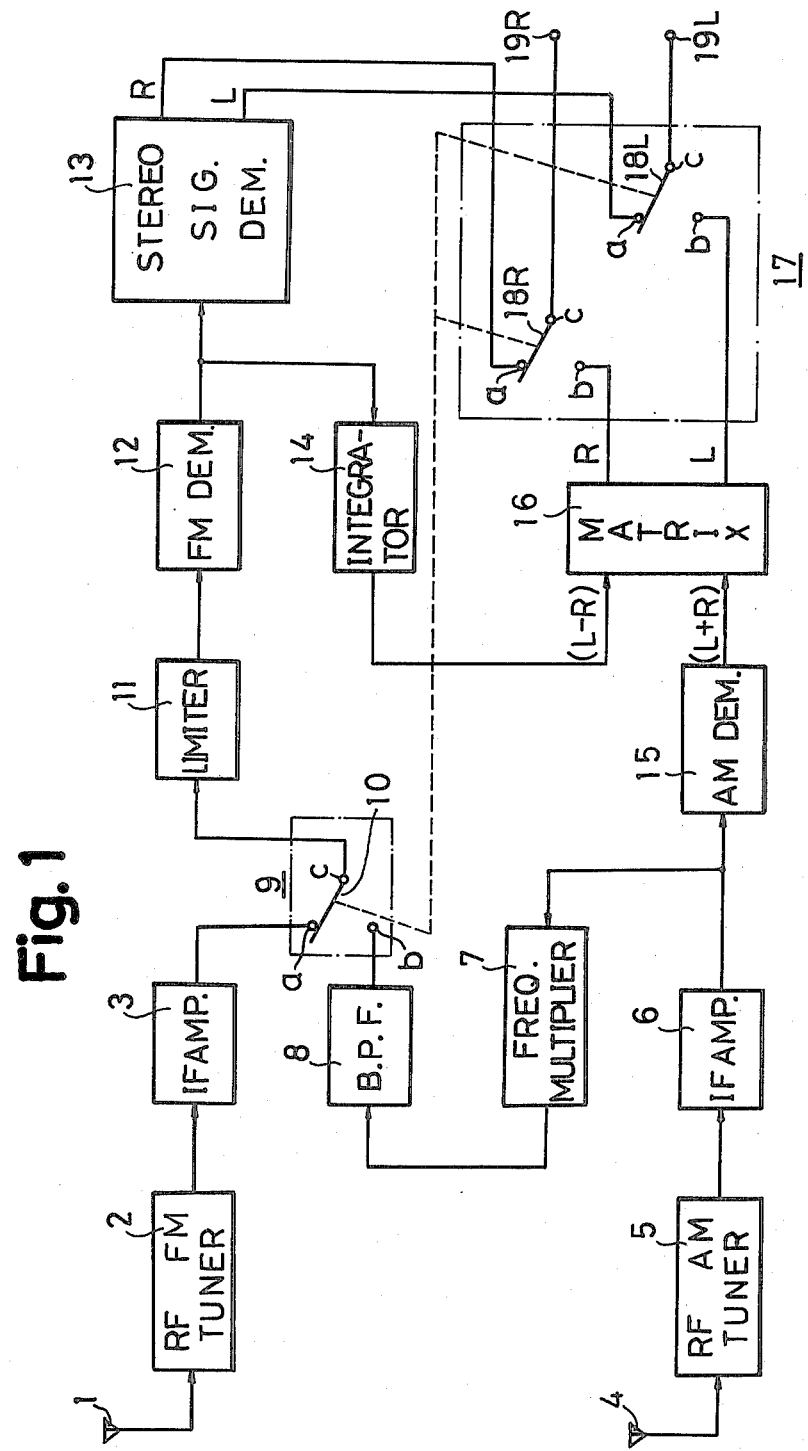
FIG. 1 is a block diagram illustrating a first embodiment of the FM/AM stereo receiver of the present invention.

In FIG. 1 there is illustrated a first embodiment of the FM/AM stereo receiver of the present invention, which is provided with an RF FM stereo tuner 2 for receiving via an RF FM stereo signal receiving antenna 1 RF FM stereo signals of the standard FM stereo broadcasting system now put into practice. The RF FM stereo tuner 2 selects, as usual, one of the RF FM stereo signals and converts the selected signal into an IF FM stereo signal which has a frequency lower than the frequency of the RF FM stereo signal. The IF FM stereo signal from the RF FM stereo tuner 2 is amplified by an IF FM stereo signal amplifier 3, as usual.

Further, the FM/AM stereo receiver of this embodiment has an RF AM stereo tuner 5 for receiving RF AM stereo signals of the aforementioned AM-PM system via an RF AM stereo signal receiving antenna 4. The RF AM stereo tuner 5 may be identical in construction with an RF tuner of an ordinary AM receiver and selects one of the RF AM stereo signals and converts the selected signal into an IF AM stereo signal which has a frequency lower than the frequency of a non-phase-modulated carrier of the RF AM stereo signal.

The IF AM stereo signal from the RF AM stereo tuner 5 is amplified by an IF AM stereo signal amplifier 6 which may be identical in construction with an IF amplifier of an ordinary AM receiver.

The IF AM stereo signal from the IF AM stereo signal amplifier 6 is supplied to a frequency multiplier 7. The frequency multiplier 7 frequency multiplies the IF AM stereo signal to obtain a frequency-multiplied IF AM stereo signal the non-phase-modulated carrier frequency of which is equal or close to a non-phase-modulated carrier frequency, such as 10.8 MHz, of the IF FM stereo signal derived from the amplifier 6. As the frequency multiplier 7, use can be made of any one of various known frequency multipliers of the type frequency multiplying an input signal to provide an output signal of a frequency 24 times higher than the imput signal frequency.

FIG. 2 shows a specific example of the frequency multiplier 7, which comprises a frequency doubler 21 connected to the output of the IF AM stereo signal amplifier 6, a frequency multiplier 22 connected to the output of the frequency doubler 21 for frequency converting the input signal to obtain an output signal of a frequency four times higher than the input signal frequency, and another frequency multiplier 23 connected to the output of the above-said frequency multiplier 22 for frequency converting the input signal to obtain an output signal of a frequency three times higher than the input signal frequency. The frequency doubler 21 is a known one, and hence will not be described in detail. The frequency doubler 21 includes a transformer 24 connected to the output of the IF AM stereo signal amplifier 6 and diodes 25 and 26 connected to a secondary winding of the transformer 24 and provides via the diodes 25 and 26 an IF AM stereo signal the non-phase-modulated carrier frequency of which is 450×2=900 KHz. The frequency multiplier 22 is also a known 4 frequency multiplier, and hence it will not be described in detail, either. The frequency multiplier 22 has a transistor 27 and a transformer 28. The transistor 27 has its base connected to the output of the frequency doubler 21 and has its collector connected to a power source 31 via a 3.6 MHz rsonance circuit 30 formed by a primary winding of the transformer 28 and a capacitor 29 and has its emitter grounded via a resistor 32. Consequently, the frequency multiplier 22 produces via the second winding of the transformer 28 an IF AM stereo signal the non-phase-modulated carrier frequency of which is 900×4=3600 MHz=3.6 MHz. The other frequency multiplier 23 is also a known 3 frequency multiplier and hence it will not be described in detail, either. The frequency multiplier 23 is provided with transistors 33, 34 and 35 and a transformer 36. The transistors 33 and 34 have their bases connected to the output of the frequency multiplier 22 and have their emitters grounded via the transistor 35 and a resistor 37 and have their collectors connected to the power source 31 via a 10.8 MHz resonance circuit 39 constituted by a primary winding of the transformer 36 and a capacitor 38. The transistors 33 and 34 are biased by a DC bias source 40 and the transistor 35 is also biased by the DC bias source 40 via resistors 41 and 42. Consequently, the frequency multiplier 23 yields an IF AM stereo signal the non-phase-modulated carrier frequency of which is 3.6×3=10.8 MHz.

The IF FM stereo signal from the IF FM stereo signal amplifier 3, which has a 10.8 MHz non-frequency-modulated carrier frequency, is provided to an FM/AM stereo signal selecting circuit 9. The FM/AM stereo signal selecting circuit 9 is supplied, via a known band-pass filter 8 of a frequency band ranging from (10.8 MHz−15×24=360 KHz) to (10.8 MHz+360 KHz), with that frequency-multiplied IF AM stereo signal from the frequency multiplier 7 which has a 10.8 MHz non-phase-modulated carrier frequency. A specific example of the FM/AM stereo signal selecting circuit 9 is provided with a switch 10 having a fixed contact a connected to the output of the IF FM stereo signal amplifier 3, another fixed contact b connected to the output of the band-pass filter 8 and a movable contact c for contact with the fixed contacts a and b. Accordingly, the IF FM stereo signal of the 10.8 MHz non-frequency-modulated carrier frequency and the frequency-multiplied IF AM stereo signal of the 10.8 MHz non-phase-modulated carrier frequency are selectively provided via the movable contact c of the switch 10.

The IF FM stereo signal and the frequency-multiplied IF AM stereo signal thus selectively provided via the movable contact c of the switch 10 are supplied to a limiter 11 which is similar to that employed in an ordinary FM stereo receiver and amplitude limits an input signal. The limiter 11 limits the amplitude of the IF FM stereo signal to provide an IF FM stereo signal which has no amplitude variation and hence is free from noise resulting from amplitude variation. Further, the limiter 11 limits the amplitude of the frequency-multiplied IF AM stereo signal to yield such a frequency-multiplied IF PM difference signal that a carrier of a frequency equal to the non-phase-modulated carrier frequency of the frequency-multiplied IF AM stereo signal has been phase modulated by a difference signal (L−R) and which is free from amplitude variation and hence has no noise by amplitude variation and has no crosstalk by a sum signal.

The output from the limiter 11 is applied to an FM demodulator 12 similar to that employed in an ordinary FM stereo receiver. The FM demodulator 12, when supplied with the IF FM stereo signal from the limiter 11, frequency demodulates it to provide a composite signal, and when supplied with the frequency-multiplied IF PM difference signal from the limiter 11, the FM demodulator 12 frequency demodulates it to derive therefrom an IF demodulated PM difference signal.

The output from the FM demodulator 12 is provided to a stereo signal demodulator 13. The stereo signal demodulator 13 has the same construction as that employed in an ordinary FM stereo receiver and hence no detailed description will be given. The stereo signal demodulator 13 derives a right signal (R) and a left signal (L) from the composite signal which is yielded by the FM demodulator 12. The output from the FM demodulator 12 is also supplied to an integrator 14. The integrator 14 integrates the IF PM difference signal from the FM demodulator 12. A cascade connection of the FM demodulator 12 and the integrator 14 constitutes a PM demodulator. Accordingly, the integrator 14 provides a difference signal (L−R). On the other hand, the IF AM stereo signal from the IF AM stereo signal amplifier 6 is applied to an AM demodulator 15 such as utilized in an AM receiver, providing a sum signal (L+R).

The sum signal (L+R) thus obtained from the AM demodulator 15 and the difference signal (L−R) from the integrator 14 are supplied to a matrix circuit 16, which performs an addition and a subtraction of the sum signal (L+R) and the difference signal (L−R) to produce a right signal (R) and a left signal (L).

The right signal (R) and the left signal (L) from the stereo signal demodulator 13 and the right signal (R) and the left signal (L) from the matrix circuit 16 are fed to an FM/AM stereo signal selecting circuit 17. The FM/AM stereo signal selecting circuit 17 comprises, for example, a switch 18R having a fixed contact a for the right signal (R) from the stereo signal demodulator 13, a fixed contact b for the right signal (R) from the matrix circuit 16 and a movable contact c for contact with these fixed contacts a and b, and another switch 18L having a fixed contact a for the left signal (L) from the stereo signal demodulator 13, a fixed contact b for the left signal (L) from the matrix circuit 16 and a movable contact c for contact with these fixed contacts a and b. The movable contacts c of the switches 18R and 18L are ganged with the movable contact c of the switch 10 of the FM/AM stereo signal selecting circuit 9. When the movable contacts c of the switches 10, 18R and 18L are respectively connected with the fixed contacts a, right and left signals (R) and (L) of FM stereo broadcasting are obtained from the movable contacts c of the switches 18R and 18L, respectively, and they are delivered to output terminals 19R and 19L connected to the movable contacts c of the switches 18R and 18L, respectively. In the case where the movable contacts c of the switches 10, 18R and 18L are connected with the fixed contacts b, right and left signals (R) and (L) of AM stereo broadcasting are yielded from the movable contacts c of the switches 18R and 18L and delivered to the output terminals 19R and 19L.

As described above, according to the FM/AM stereo receiver of the present invention shown in FIG. 1, in the case of the IF FM stereo signal amplifier 3 and the stereo signal demodulator 13 being selected by the FM/AM signal selecting circuits 9 and 17, respectively, there is constituted an FM stereo receiving system by the RF FM stereo signal receiving antenna 1, the RF FM stereo tuner 2, the IF FM stereo signal amplifier 3, the limiter 11, the FM demodulator 12, the stereo signal demodulator 13 and the output terminals 19R and 19L, whereby stereo signals of the FM stereo broadcasting, that is, the right and left signals (R) and (L) can be reproduced. When the band-pass filter 8 and the matrix circuit 16 are selected by the FM/AM selecting circuits 9 and 17, respectively, there is established an AM stereo receiving system by the RF AM stereo signal receiving antenna 4, the RF AM stereo tuner 5, the IF AM stereo signal amplifier 6, the frequency multiplier 7, the band-pass filter 8, the limiter 11, the PM demodulator composed of the FM demodulator 12 and the integrator 14, the AM demodulator 15, the matrix circuit 16 and the output terminals 19R and 19L. Thus, stereo signals of the AM stereo broadcasting, that is, the right and left signals (R) and (L) can be reproduced.

The limiter 11 and the FM demodulator 12 are employed in both cases of reproducing the stereo signal of the FM stereo broadcasting by the FM stereo receiving system and the stereo signal of the AM stereo broadcasting by the AM stereo receiving system. In other words, the single limiter 11 is used as a limiter in the FM stereo receiving system and as a limiter in the AM stereo receiving system. Further, the single FM demodulator 12 is utilized as an FM demodulator in the FM stereo receiving system and as an FM demodulator forming the PM demodulator in the AM stereo receiving system. On the other hand, the frequency multiplier 7 and the bans-pass filter 8 can be made simple-structured, small-sized and inexpensive.

Accordingly, the FM/AM stereo receiver of the present invention depicted in FIG. 1 exhibits the advantages of simple construction, small size and low manufacturing cost over prior art FM/AM stereo receivers.

Moreover, according to the FM/AM stereo receiver of FIG. 1, the non-phase-modulated carrier frequency of the frequency-multiplied IF PM difference signal, which is supplied to the PM demodulator formed by the cascade connection of the FM demodulator 12 and the integrator 14 in the AM stereo receiving system, is 10.8 MHz which is 24 times as high as a non-phase-modulated carrier frequency 450 KHz of an IF PM difference signal which is applied to a PM demodulator in the prior art FM/AM stereo receiver. Therefore, the amount of frequency deviation of the frequency-multiplied IF PM difference signal is 24 times larger than the amount of frequency deviation of an IF PM difference signal in the prior art. Accordingly, the IF demodulated PM difference signal from the FM demodulator 12 can be obtained at a high level, so that the difference signal (L−R) from the integrator 14 and consequently from the PM demodulator can be obtained with an excellent SN ratio.

In consequence, the FM/AM stereo receiver of FIG. 1 possesses the advantage of capability of reproducing stereo signals of good quality as compared with the conventional FM/AM stereo receivers.

Next, a description will be given, with reference to FIG. 3, of a second embodiment of the FM/AM stereo receiver of the present invention.

Figure 3:
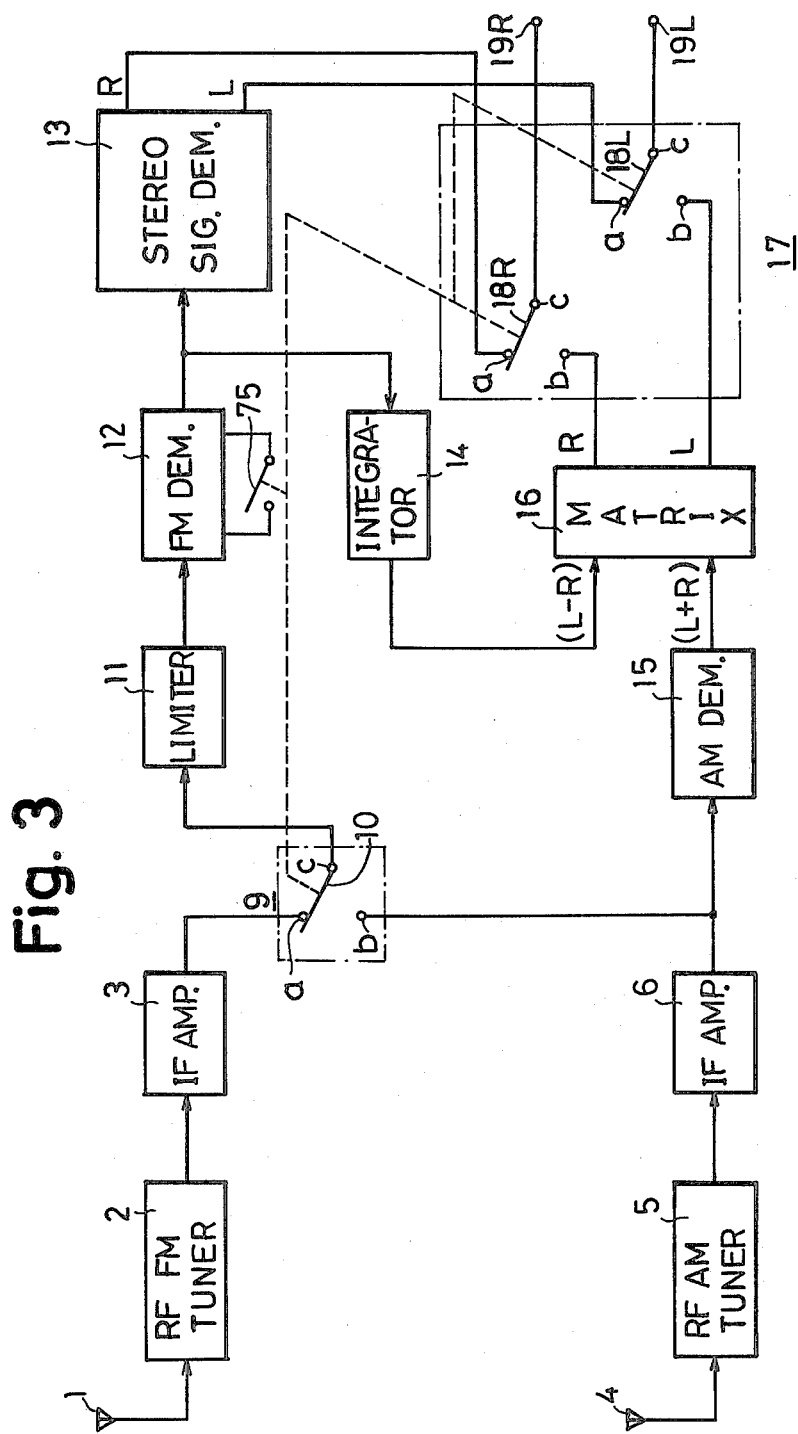
FIG. 3 is a block diagram illustrating a second embodiment of the present invention.

In FIG. 3, the parts corresponding to those in FIG. 1 are identified by the same reference numerals and no detailed description will be repeated. The second embodiments is identical in construction with the first embodiment except that since the frequency multiplier 7 and the band-pass filter 8 are left out, the output of the IF AM stereo signal amplifier 6 is connected to the fixed contact b of the switch 10 of the FM/AM stereo switching circuit 9, and that the FM demodulator 12 has such a construction as described later.

In this embodiment, the IF AM stereo signal amplifier 6 is selected by the FM/AM stereo signal selecting circuit 9. In this case, the limiter 11 is supplied with an IF AM stereo signal of a 450 KHz intermediate frequency from the IF AM stereo signal amplifier 6. The limiter 11 limits the amplitude of the IF AM stereo signal to yield such an IF AM difference signal that a carrier of a frequency (450 KHz) equal to the non-phase-modulated carrier frequency of the IF AM stereo signal has been phase modulated by the difference signal (L−R). As a result of this, when the FM/AM stereo signal selecting circuit 9 is selecting the IF FM stereo signal amplifier 3, the FM demodulator 12 is supplied with the IF FM stereo signal from the limiter 11. When the FM/AM stereo signal selecting circuit 9 is selecting the IF AM stereo signal amplifier 6, the limiter 11 supplies the FM demodulator 12 with an IF PM difference signal which has a non-phase-modulated carrier frequency lower than the non-frequency-modulated carrier frequency of the IF FM stereo signal. Accordingly, consideration should be given to the FM demodulator 12 therefor. The FM demodulator 12 can be constructed as an ordinary "quadrature detector" having a phase shifter. In this case, it is necessary to associate the phase shifter with means for changing its phase constant so that a predetermined constant phase shift of 90° may equally be produced for either of the IF FM stereo signal and the IF PM difference signal.

Figure 4:
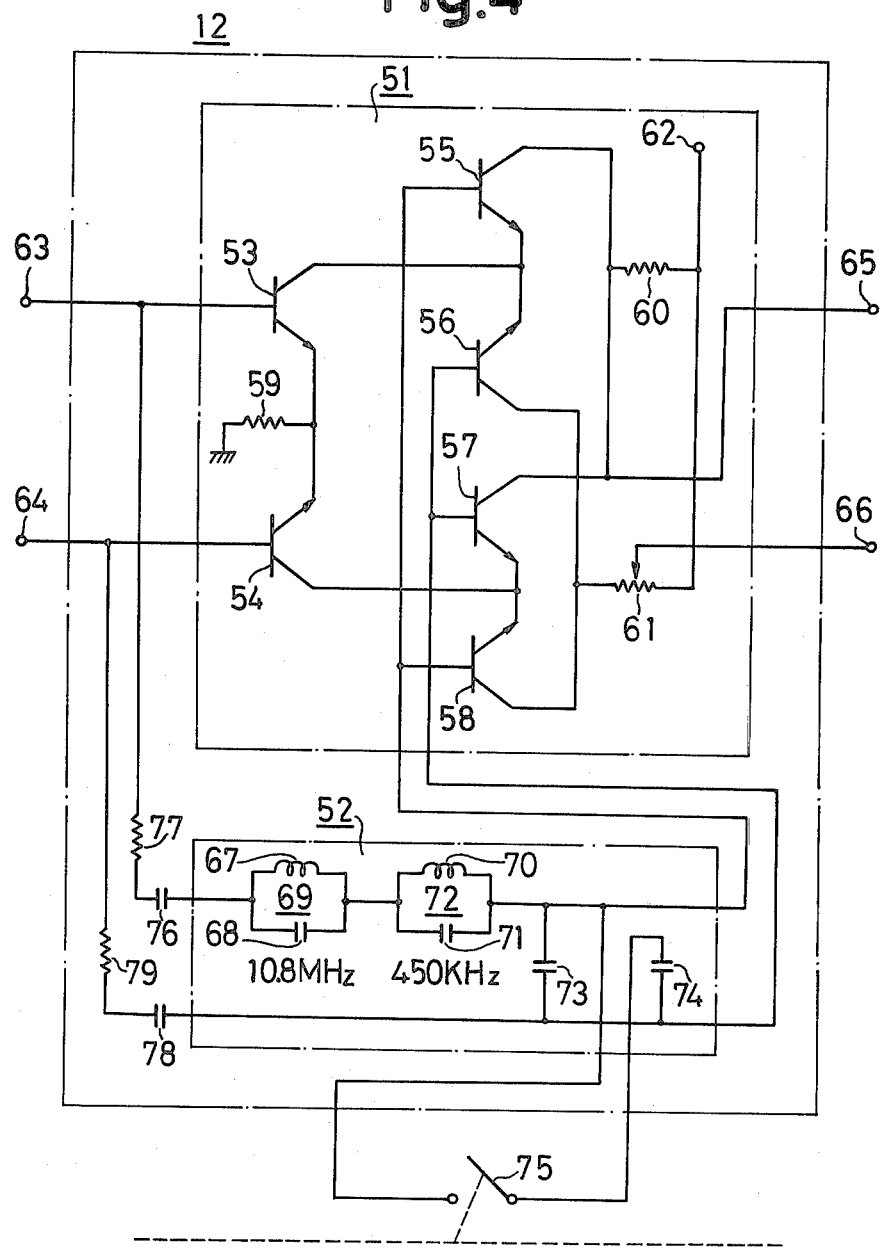
FIG. 4 is a connection diagram showing an example of an FM demodulator utilized in the embodiment of FIG. 3.

FIG. 4 illustrates an example of the FM demodulator 12 of the "quadrature detector" construction, which has a double balanced differential type multiplier 51 and a phase shifter 52. The multiplier 51 has transistors 53 to 58. The transistors 53 and 54 have their bases connected to input terminals 63 and 64 connected to outputs of the limiter 11 and have their emitters grounded via a resistor 59. The transistor 53 has its collector connected to the emitters of the transistors 55 and 56 and the transistor 54 has its collector connected to the emitters of the transistors 57 and 58. The transistors 55 and 57 have their collectors connected via a resistor 60 to a power source 62. The transistors 56 and 58 have their collectors connected via a resistor 61 to the power source 62. The transistors 55 and 58 have their bases connected to one of two outputs of the phase shifter 52 and the transistors 56 and 57 have their bases connected to the other output of the phase shifter 52. From the collectors of the transistors 55 and 57 is led out the one output terminal 65 of the multiplier 51 and from the resistor 61 is led out the other output terminal 66. In the multiplier 51, there are not shown DC base and collector bias circuits of the transistors 53 and 54 and DC base bias circuits of the transistors 55 to 58. One of the inputs of the phase shifter 52 is connected to an input terminal 63 via a DC blocking capacitor 76 and a resistor 77 and, similarly, the other output is connected to an input terminal 64 via a DC blocking capacitor 78 and a resistor 79. One of two outputs of the phase shifter 52 is connected to the bases of the transistors 55 and 58 and the other output is connected to the bases of the transistors 56 and 57. The transistors 53 and 54 are turned ON and OFF reversely of each other by the output from the limiter 11 which is produced across the output terminals 63 and 64. The transistors 55, 58 and 56, 57 are turned ON and OFF reversely of each other by the output from the phase shifter 52. The phase shifter 52 is provided with a series arm by a resonance circuit 69 of a 10.8 MHz resonance frequency, formed by a parallel circuit of an inductor 67 and a capacitor 68, and a resonance circuit 72 of a 450 KHz resonance frequency, formed by a parallel circuit of an inductor 70 and a capacitor 71, and parallel arms by capacitors 73 and 74. The parallel arm by the capacitor 74 is formed by a switch 75. The switch 75 is ganged with the switch 10 of the FM/AM stereo signal selecting circuit 9 and closes only when the movable contact c of the switch 10 is connected with the fixed contact b. When the switch 75 is open, the phase shifter 52 imparts a 90° phase shift to the input signal having the frequency (10.8 MHz) of the non-frequency-modulated carrier of the IF FM stereo signal. When the switch 75 remains closed, the phase shifter 52 also imparts a 90° phase shift to the input signal having the frequency (450 KHz) of the non-phase-modulated carrier of the IF PM difference signal. The FM demodulator 12 can be formed not only as the "quadrature detector" but also as an ordinary "pulse counting demodulator".

FIG. 5 illustrates an example of the FM demodulator of the "pulse counting demodulator". An input terminal 81 connected to the output of the limiter 11 is connected via an FM/AM stereo signal selecting circuit 82 to the input of a cascade-connected circuit 87 of a limiter 83, a differentiation circuit 84, a monostable multivibrator 85 and an integrator 86 and to the input of a frequency multiplier 89. The output of the circuit 87 is connected to an output terminal 88. The IF PM difference signal from the limiter 11 is frequency multiplied by the multipier 89, to produce a frequency-multiplied IF PM difference signal which has a non-phase modulated carrier frequency equal or close to the non-frequency-modulated carrier frequency (10.8 MHz) of the IF FM stereo signal derived from the limiter 11. The frequency multiplier 89 may be of the same construction as that of the frequency multiplier 7 employed in the embodiment of FIG. 1. The output of the frequency multiplier 89 is connected via the FM/AM signal selecting circuit 82 to the input of the cascade-connected circuit 87. The FM/AM stereo signal selecting circuit 82 is formed by a switch 90 having a fixed contact a connected to the input terminal 81, a fixed contact b connected to the output of the frequency multiplier 89 and a movable contact c for contact with these fixed contacts a and b. The movable contact c of the switch 90 is connected to the input of the cascade-connected circuit 87 and ganged with the movable contact c of the switch 10 of the FM/AM stereo signal selecting circuit 9. In FIG. 3, there is shown the switch 75 which is used in the case where the FM demodulator 12 has the "quadrature detector" structure of FIG. 4, but there is not depicted the FM/AM stereo signal selecting circuit 82 which is employed in the case where the FM demodulator 12 has the "pulse counting demodulator" structure of FIG. 5.

Whether it is constructed as the "quadrature detector" of FIG. 4 or the "pulse counting demodulator" of FIG. 5, the FM demodulator 12, when supplied with the IF FM stereo signal from the limiter 11, frequency demodulates it to produce the composite signal as is the case with FIG. 1. When supplied with the IF PM difference signal from the limiter 11, the FM demodulator 12 frequency demodulates it to yield the IF demodulate PM difference signal. The output from the FM demodulator 12 is fed to the integrator 14. The cascade-connected circuit of the FM demodulator 12 and the integrator 14 constitutes a PM demodulator as in the case of FIG. 1. Accordingly, the difference signal (L−R) is obtained from the ingegrator 14.

According to the FM/AM stereo receiver of FIG. 3, in the case where the IF FM stereo signal amplifier 3 and the stereo signal demodulator 13 are selected by the FM/AM stereo signal selecting circuits 9 and 17, respectively, there is set up the same FM stereo receiving system as in the case of FIG. 1, by which it is possible to reproduce the stereo signals (R) and (L) of the FM stereo broadcasting. In the case where the IF AM stereo signal amplifier 6 and the matrix circuit 16 are selected by the FM/AM stereo signal selecting circuits 9 and 17, respectively, there is established an AM stereo receiving system without using the frequency multiplier 7 and the band-pass filter 8 which are needed in the embodiment of FIG. 1 and the stereo signals (R) and (L) of the AM stereo broadcasting are reproduced as is the case with FIG. 1.

Also in the case of the FM/AM stereo receiver of FIG. 3, the single limiter 11 is employed in common to the FM and AM stereo receiving systems, and the single FM demodulator 12 is used as an FM demodulator of the FM stereo receiving system and as an FM demodulator forming the PM demodulator of the AM stereo receiving system.

Accordingly, the FM/AM stereo receiver of FIG. 3 is also advantageous in that it can be made simple, small and inexpensive as compared with the conventional FM/AM receivers.

Figure 6:
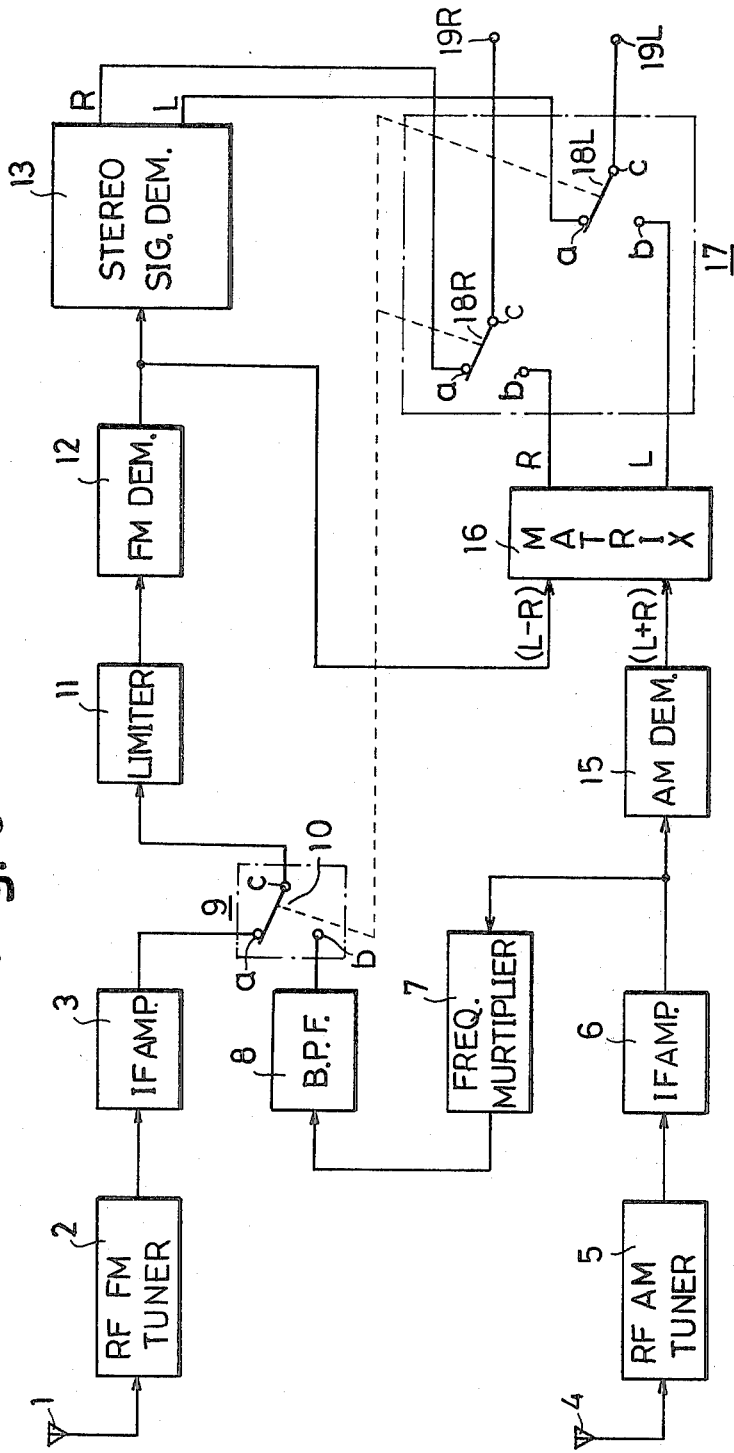
FIG. 6 is a block diagram illustrating a third embodiment of the present invention.

Referring now to FIG. 6, a third embodiment of the present invention will hereinafter be described.

In FIG. 6, the parts corresponding to those in FIG. 1 are marked with the same reference numerals and no detailed description will be repeated. This embodiment is also identical in construction with the embodiment of FIG. 1 except that the integrator 14 used in the latter is omitted and consequently the output from the FM demodulator 12 is supplied directly to the one input of the matrix circuit 16, as described later.

In the embodiment of FIG. 6, however, an RF AM stereo signal of the AM-FM system is provided via the RF AM stereo signal receiving antenna 4 to the RF AM stereo tuner 5 instead of the RF AM stereo signal of the AM-PM system. As a result of this, in the case of the band-pass filter 8 being selected by the FM/AM stereo signal selecting circuit 9, the limiter 11 yields, instead of a frequency-multiplied IF PM difference signal, such a frequency-multiplied IF FM difference signal that a carrier of a frequency (10.8 MHz) equal to the non-frequency-modulated carrier frequency of the frequency-multiplied IF AM stereo signal has been frequency-modulated by the difference signal (L−R). Further, since the limiter 11 provides the frequency-multiplied IF FM difference signal instead of the frequency-multiplied IF PM difference signal, the FM demodulator 12 produces the difference signal (L−R).

Accordingly, in the FM/AM stereo receiver of FIG. 6, the integrator 14 is left out and consequently the difference signal (L−R) from the FM demodulator 12 is supplied directly to the one input of the matrix circuit 16.

According to the FM/AM stereo receiver of FIG. 6, when the FM/AM stereo signal selecting circuits 9 and 17 are selecting the IF FM stereo signal amplifier 3 and the stereo signal demodulator 13, respectively, there is formed an FM stereo receiving system similar to that in the case of FIG. 1, so that the stereo signals (R) and (L) of the FM stereo broadcasting can be reproduced. When selecting the IF AM stereo signal amplifier 6 and the matrix circuit 16 by the FM/AM stereo signal selecting circuits 9 and 17, respectively, there is constituted an AM stereo receiving system without using the integrator 14 in FIG. 1, reproducing the stereo signals (R) and (L) of the AM stereo broadcasting as is the case with the embodiment of FIG. 1.

In the embodiment of FIG. 6, too, the limiter 11 is employed in common to the FM and AM stereo receiving systems. Also the FM demodulator 12 is equally used for both of the FM and AM stereo receiving systems.

Accordingly, the FM/AM stereo receiver of FIG. 6 can also be made simpler, smaller and less expensive than the FM/AM stereo receivers heretofore employed.

Moreover, according to the FM/AM stereo receiver of FIG. 6, the non-phase-modulated carrier frequency of the frequency-multiplied IF FM difference signal which is supplied to the FM demodulator 12 in the AM stereo receiving system is 24 times higher than a non-frequency-modulated carrier frequency 450 KHz of an IF FM difference signal which is supplied to an FM demodulator in the conventional FM/AM stereo receiver. Therefore, the difference signal (L−R) from the FM demodulator 12 has an excellent SN ratio.

Accordingly, the FM/AM stereo receiver of FIG. 6 also has the advantage that stereo signals of good quality, as compared with those obtainable in the prior art, can be reproduced.

Figure 7:
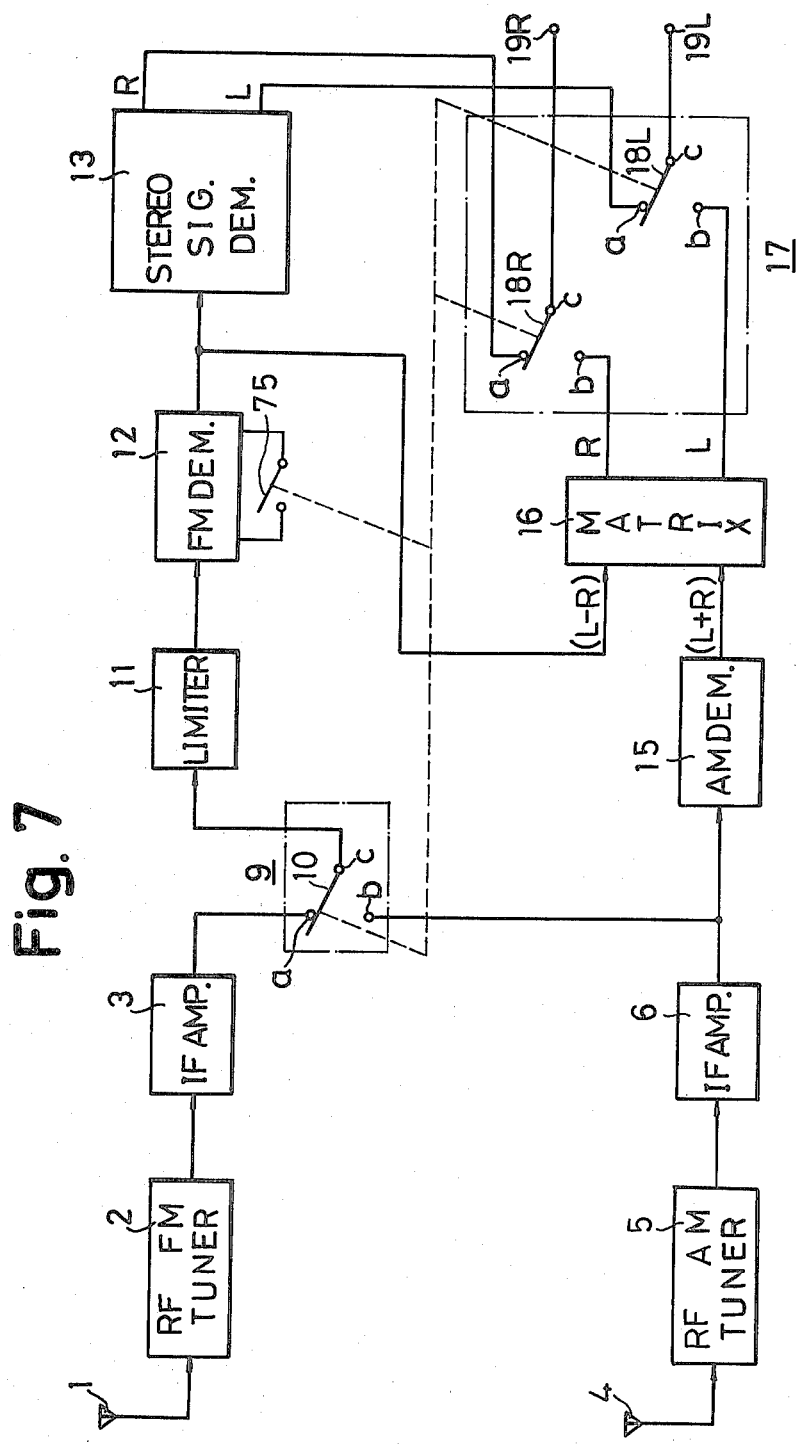
FIG. 7 is a block diagram illustrating a fourth embodiment of the present invention.

Turning next to FIG. 7, a fourth embodiment of the present invention will hereinafter be described. In FIG. 7, the parts corresponding to those in FIG. 3 are identified by the same reference numerals. This embodiment is identical in construction with the embodiment of FIG. 3 except that the integrator 14 is left out and consequently the output from the FM demodulator 12 provided directly to the one input of the matrix circuit 16, as will be described later.

In the embodiment of FIG. 7, however, the RF AM tuner 5 is supplied, via the RF AM stereo signal receiving antenna 4, with the RF AM stereo signal of the AM-FM system as is the case with the embodiment of FIG. 6. As a result of this, in the case of the IF AM stereo signal amplifier 6 being selected by the FM/AM stereo signal selecting circuit 9, the limiter 11 provides, instead of the IF PM difference signal, an IF FM difference signal such that a carrier of a frequency (450 KHz) equal to the non-frequency-modulated carrier frequency of the IF AM stereo signal has been frequency modulated by the difference signal (L−R). Further, the FM demodulator 12 yields the difference signal (L−R).

Accordingly, in the FM/AM stereo receiver of FIG. 7, the integrator 14 in the embodiment of FIG. 3 is omitted and consequently the difference signal (L−R) from the FM demodulator 12 is applied directly to the one input of the matrix circuit 16.

According to the embodiment of FIG. 7, in the case of the IF FM stereo signal amplifier 3 and the stereo signal demodulator 13 being selected by the FM/AM stereo signal selecting circuits 9 and 17, respectively, there is set up an FM stereo receiving system similar to that in the embodiment of FIG. 3, reproducing the stereo signals (R) and (L) of the FM stereo broadcasting. When selecting the IF AM stereo signal amplifier 6 and the matrix circuit 16 by the FM/AM stereo signal selecting circuits 9 and 17, there is established an AM stereo receiving system without using the integrator 14 in FIG. 3, reproducing the stereo signals (R) and (L) of the AM stereo broadcasting.

Also in the FM/AM stereo receiver of FIG 7, the limiter 11 and the FM demodulator 12 are respectively employed in common to both of the FM and AM stereo receiving systems.

Accordingly, this embodiment also possesses the advantages of simple structure, small size and low manufacturing cost over the prior art.

It will be apparent that many modifications and variations may be effected without departing from the novel concepts of this invention.

What is claimed is:

1. An FM/AM stereo receiver comprising:
   an RF FM stereo tuner for selecting and converting an RF FM stereo signal into an IF FM stereo signal;
   an IF FM stereo amplifier for amplifying the IF FM stereo signal from the RF FM stereo tuner;
   an RF AM stereo tuner for selecting and converting an RF AM stereo signal of an AM-PM system into an IF AM stereo signal;
   an IF AM stereo amplifier for amplifying the IF AM stereo signal from the RF AM stereo tuner;
   a frequency multiplier for frequency multiplying the IF AM stereo signal from the IF AM stereo amplifier to obtain a frequency-multiplied IF AM stereo signal the non-phase-modulated carrier frequency of which is equal or close to a non-frequency-modulated carrier of the IF FM stereo signal from the IF FM stereo amplifier;
   FM/AM stereo signal selecting means for selecting the IF FM stereo signal from the IF FM stereo amplifier and the frequency-multiplied IF AM stereo signal from the frequency multiplier;
   a limiter for amplitude limiting the IF FM stereo signal from the FM/AM stereo signal selecting means and amplitude limiting the frequency-multiplied IF AM stereo signal from the FM/AM stereo signal selecting means to obtain a frequency-multiplied IF PM difference signal;
   an FM demodulator for frequency demodulating the IF FM stereo signal from the limiter into a composite stereo signal and frequency demodulating the frequency-multiplied IF PM difference signal from the limiter to obtain an IF demodulated PM difference signal;
   a stereo signal demodulator for deriving left and right signals from the composite stereo signal provided from the FM demodulator;
   an integrator for integrating the IF demodulated PM difference signal from the FM demodulator to obtain a difference signal;
   an AM demodulator for amplitude demodulating the IF AM stereo signal from the IF AM stereo amplifier to obtain a sum signal; and
   a matrix circuit for deriving left and right signals from the sum signal and the difference signal provided from the AM demodulator and the integrator, respectively.

2. An AM/FM stereo receiver comprising:
   an RF FM stereo tuner for selecting and converting an RF FM stereo signal into an IF FM stereo signal;
   an IF FM stereo amplifier for amplifying the IF FM stereo signal from the RF FM stereo tuner;
   an RF AM stereo tuner for selecting and converting an RF AM stereo signal of an AM-PM system into an IF AM stereo signal;
   an IF AM stereo amplifier for amplifying the IF AM stereo signal from the RF AM stereo tuner;
   FM/AM stereo signal selecting means for selecting the IF FM stereo signal from the IF FM stereo amplifier and the IF AM stereo signal from the IF AM stereo amplifier;
   a limiter for amplitude limiting the IF FM stereo signal from the FM/AM stereo signal selecting means and amplitude limiting the IF AM stereo signal from the FM/AM stereo signal selecting means to obtain an IF PM difference signal;
   an FM demodulator for frequency demodulating the IF FM stereo signal from the limiter into a composite stereo signal and frequency demodulating the IF PM difference signal from the limiter to obtain an IF demodulated PM difference signal;
   a stereo signal demodulator for deriving left and right signals from the composite stereo signal provided from the FM demodulator;
   an integrator for integrating the IF demodulated PM difference signal from the FM demodulator to obtain a difference signal;

an AM demodulator for amplitude demodulating the IF AM stereo signal from the IF AM stereo amplifier to obtain a sum signal; and a matrix circuit for deriving left and right signals from the sum signal and the difference signal provided from the AM demodulator and the integrator, respectively.

3. An FM/AM stereo receiver according to claim 2 wherein the FM demodulator is constructed as a "quadrature detector" having a phase shifter and the phase shifter is associated with means for changing its phase constant so that a predetermined constant phase shift may be obtained for either of a signal having the non-frequency-modulated carrier frequency of the IF FM stereo signal and a signal having the non-phase-modulated carrier frequency of the IF PM difference signal.

4. An FM/AM stereo receiver according to claim 2 wherein the FM demodulator is constructed as a "pulse counting demodulator" having a frequency multiplier and wherein the IF FM stereo signal is frequency demodulated by the frequency multiplier and the IF PM difference signal is frequency demodulated by the frequency multiplier.

5. An FM/AM stereo receiver comprising:

an RF FM stereo tuner for selecting and converting an RF FM stereo signal into an IF FM stereo signal;

an IF FM stereo amplifier for amplifying the IF FM stereo signal from the RF FM stereo tuner;

an RF AM stereo tuner for selecting and converting an RF AM stereo signal of an AM-FM system into an IF AM stereo signal;

an IF AM stereo amplifier for amplifying the IF AM stereo signal from the RF AM stereo tuner;

a frequency multiplier for frequency multiplying the IF AM stereo signal from the IF AM stereo amplifier to obtain a frequency-multiplied IF AM stereo signal the non-frequency-modulated carrier frequency of which is equal or close to a non-frequency modulated carrier of the IF FM stereo signal from the IF FM stereo amplifier;

FM/AM stereo signal selecting means for selecting the IF FM stereo signal from the IF FM stereo amplifier and the frequency-multiplied IF AM stereo signal from the frequency multiplier;

a limiter for amplitude limiting the IF FM stereo signal from the FM/AM stereo signal selecting means and amplitude limiting the frequency-multiplied IF AM stereo signal from the FM/AM stereo signal selecting means to obtain a frequency-multiplied IF FM difference signal;

an FM demodulator for frequency demodulating the IF FM stereo signal from the limiter into a composite stereo signal and frequency demodulating the frequency-multiplied IF FM difference signal from the limiter to obtain a difference signal;

a stereo signal demodulator for deriving left and right signals from the composite stereo signal provided from the FM demodulator;

an AM demodulator for amplitude demodulating the IF AM stereo signal from the IF AM stereo amplifier to obtain a sum signal; and a matrix circuit for deriving left and right signals from the sum signal and the difference signal provided from the AM demodulator and the FM demodulator, respectively.

6. An FM/AM stereo receiver comprising:

an RF FM stereo tuner for selecting and converting an RF FM stereo signal into an IF FM stereo signal;

an IF FM stereo amplifier for amplifying the IF FM stereo signal from the RF FM stereo tuner;

an RF AM stereo tuner for selecting and converting an RF AM stereo signal of an AM-FM system into an IF AM stereo signal;

an IF AM stereo amplifier for amplifying the IF AM stereo signal from the RF AM stereo tuner;

FM/AM stereo signal selecting means for selecting the IF FM stereo signal from the IF FM stereo amplifier and the IF AM stereo signal from the IF AM stereo amplifier;

a limiter for amplitude limiting the IF FM stereo signal from the FM/AM stereo signal selecting means and amplitude limiting the frequency-multiplied IF AM stereo signal from the FM/AM stereo signal selecting means to obtain a IF FM difference signal;

an FM demodulator for frequency demodulating the IF FM stereo signal from the limiter into a composite stereo signal and frequency demodulating the IF FM difference signal from the limiter to obtain a difference signal;

a stereo signal demodulator for deriving left and right signals from the composite stereo signal provided from the FM demodulator;

an AM demodulator for amplitude demodulating the IF AM stereo signal from the IF AM stereo amplifier to obtain a sum signal; and a matrix circuit for deriving left and right signals from the sum signal and the difference signal provided from the AM demodulator and the FM demodulator, respectively.

7. An FM/AM stereo receiver according to claim 6 wherein the FM demodulator is constructed as a "quadrature detector" having a phase shifter and the phase shifter is associated with means for changing its phase constant so that a predetermined constant phase shift may be obtained for either of a signal having the non-frequency-modulated carrier frequency of the IF FM stereo signal and a signal having the non-frequency-modulated carrier frequency of the IF FM difference signal.

8. An FM/AM stereo receiver according to claim 6 wherein the FM demodulator is constructed as a "pulse counting demodulator" having a frequency multiplier and wherein the IF FM stereo signal is frequency demodulated by the frequency multiplier and the IF FM difference signal is frequency demodulated by the frequency multiplier.

* * * * *